United States Patent [19]

Johary

[11] Patent Number: 4,722,470
[45] Date of Patent: Feb. 2, 1988

[54] METHOD AND TRANSFER PLATE FOR APPLYING SOLDER TO COMPONENT LEADS

[75] Inventor: Ajay Johary, Rochester, Minn.

[73] Assignee: International Business Machines Corporation, Armonk, N.Y.

[21] Appl. No.: 936,574

[22] Filed: Dec. 1, 1986

[51] Int. Cl.⁴ .................... B23K 31/02; B23K 35/14
[52] U.S. Cl. ........................... 228/180.2; 228/256; 228/259; 228/56.1; 118/225; 118/255; 427/282; 437/246
[58] Field of Search .............. 228/180.2, 180.1, 56.1, 228/256, 259, 248; 118/216, 225, 255; 427/277, 282, 272, 88, 120, 123

[56] References Cited

U.S. PATENT DOCUMENTS 4,396,140  8/1983  Jaffe et al. ................. 228/180.2

FOREIGN PATENT DOCUMENTS 2728330  1/1979  Fed. Rep. of Germany ... 228/180.2

Primary Examiner—Nicholas P. Godici
Assistant Examiner—Samuel M. Heinrich
Attorney, Agent, or Firm—Mason, Kolehmainen, Rathburn & Wyss

[57] ABSTRACT

A method and a solder transfer member for applying discrete bodies of solder of predetermined size to the leads of a component for subsequent surface mounting to a substrate. The transfer member is a plate having a non-wetted surface, for example titanium, with an array of cavities matching the component lead pattern, each having a volume corresponding to the desired amount of solder to be applied to the corresponding lead. The method includes placing solder paste on the transfer member and filling the cavities by wiping the plate surface. The component is placed on the transfer member with the leads contacting the solder paste in the cavities. Reflow of the solder paste bonds to each lead a discrete body of solder having a precisely determined size. To limit wicking of solder on the leads, selective masking may be performed by applying a water soluble mask coating to the leads and removing the mask from selected areas by placing the component against a surface charged with water before placing the component on the transfer member.

19 Claims, 8 Drawing Figures

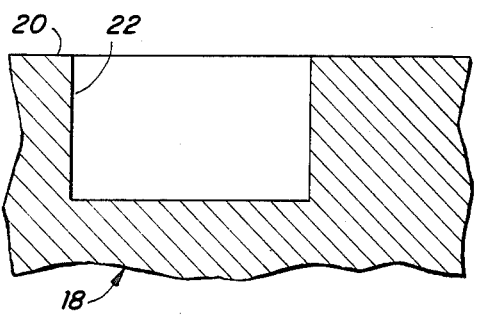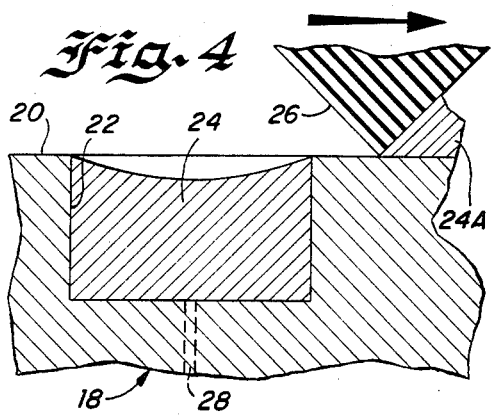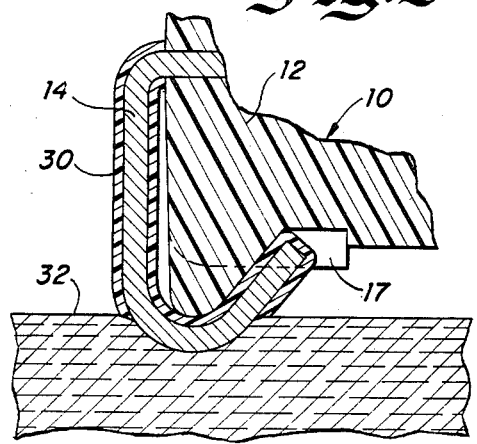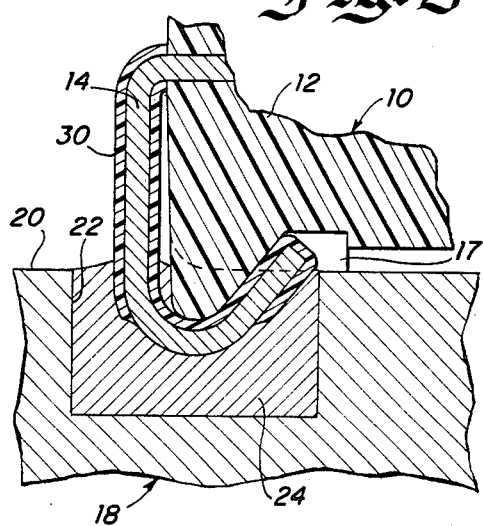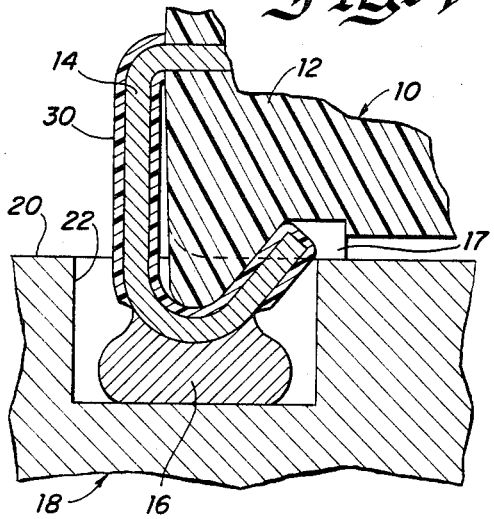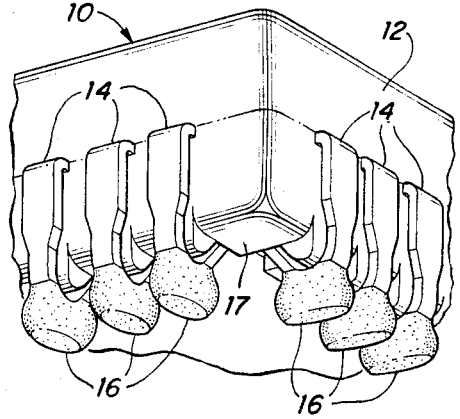

METHOD AND TRANSFER PLATE FOR APPLYING SOLDER TO COMPONENT LEADS

BACKGROUND OF THE INVENTION

The present invention relates to the application of solder to component leads for subsequent surface mounting to a substrate.

Due to advantages such as small component size, reduced board area requirements, decreasing costs and shorter signal paths, surface mount technology is gain wider acceptance in mounting components to substrates. In a typical surface mounting manufacturing process, solder paste is placed on conductive pads or regions of a substrate such as a circuit board using a screen or stencil printing operation. A component is placed on the board with its leads contacting the solder paste. A reflow operation is performed to melt the solder and create a solder bond between each lead and its corresponding conductive region.

As the spacing of leads on circuit components becomes closer, the difficulties in achieving consistent and reliable results with surface mount technology increase. Lead to lead spacings of 0.050 inch are common, and closer spacings such as 0.025 inch are anticipated. Known methods are subject to difficulties including bridging and the consequent short circuiting of solder between adjacent solder joints, open circuits and voids due to insufficient solder in a solder joint and excessive solder at a solder joint interfering with the ability of an installed component to withstand temperature variations.

Such difficulties are much worse when rework is required after initial installation. Rework, i.e., removal and replacement of a component, may be necessary when an original solder joint is defective or when the component is faulty. Initial production techniques such as screen or stencil printing of solder paste may not be practical during rework. As a result, laborious manual methods may be required and satisfactory results may be difficult to attain.

For example, in past rework procedures, the solder joints are melted and the component is removed. The substrate or circuit board mounting region is then cleaned and dressed by removing extraneous solder from the conductive regions of the substrate. Solder paste is then applied, for example, with a syringe. A component to be installed is then positioned and a reflow operation is carried out. In addition to the painstaking nature of the procedure, another difficulty is that the volume of solder paste applied cannot be precisely controlled and variations in the solder joints lead to inconsistencies and problems such as those referred to above.

A different approach has been proposed in which solder material is applied to the component leads rather than to the substrate prior to the surface mounting reflow operation. One such approach is described in an article entitled A NEW SOLDER TRANSFER APPLICATION TECHNIQUE (STAT) FOR COATING LEADS OF APPLIQUE COMPONENTS, International Journal of Hybrid Microelectronics, Vol. 4, #2, pages 14–18, 1981 and in U.S. Pat. No. 4,396,140. In this process, solder is deposited on the flat surface of a solder transfer member or "substrate" in discrete pads corresponding to the component leads. The leads are placed on the solder pads and the solder is reflowed to adhere to the leads. This process is subject to the necessity for accurate measurement and placement of solder pads on the transfer member. If the solder is applied by screen printing, accurate stencil alignment is required each time the process is performed. With stencil printing, the volume of solder that can be present in a solder pad is inherently limited. Also of concern is bridging between unrestrained solder pads during reflow, especially when lead to lead spacing is close or the quantity of solder is large.

SUMMARY OF THE INVENTION

Among the principal objects of the present invention are to provide a method and a transfer member for applying solder in precisely regulated amounts to the leads of a component to be surface mounted; to avoid the problem of bridging or short circuiting between solder joints even with close spacing or relatively large solder volumes; to provide a method and transfer member avoiding the necessity for precise stencil alignment; to overcome the serious difficulties experienced in rework operations and in initial installations of surface mounted components; to provide a method and a transfer member for use in a method capable of being performed quickly and easily without the necessity for painstaking manual operations or complex and expensive specialized equipment; to provide a method and transfer member permitting the use of large and accurately controlled solder volumes; to provide a method and a solder transfer member well suited to automated manufacturing techniques; and to provide a method and apparatus overcoming difficulties experienced with those used in the past.

In brief, in accordance with the above and other objects of the present invention, there is provided a method and a solder transfer member for bonding discrete, accurately sized bodies of solder to the leads of a component for subsequent attachment by surface mounting to a substrate. The method includes arraying discrete quantities of solder material with respect to a solder transfer member in an array corresponding to the pattern of leads of the component. The component is located on the solder transfer member with the component leads contacting the solder material, and a body of solder of predetermined size is bonded to each lead by reflowing the discrete quantities of solder material. The method is characterized by loading the discrete quantities of solder material into cavities in a surface of the solder transfer member, the cavities being in an array matching the pattern of component leads. The component leads are aligned in registration with the array of cavities, and at least a portion of each lead is inserted into a cavity in contact with the solder material.

A solder transfer member in accordance with the present invention is a plate formed of a material remaining substantially rigid at a temperature above the melting point of solder. The plate includes a surface formed of a material non-wetted by solder. A plurality of cavities are defined in the surface and are arrayed in the same pattern as the pattern of component leads. The cavities are unrestricted so that withdrawal of solid solder material from the cavities is facilitated.

DESCRIPTION OF THE VIEWS OF THE DRAWING

The present invention together with the above and other objects and advantages may best appear from the following detailed description of the preferred embodiment of the invention in which reference is made to the accompanying drawings wherein:

FIG. 3 is an enlarged sectional view showing a cavity in the solder transfer member of FIG. 2;

FIG. 4 is a view similar to FIG. 3 illustrating the loading of solder material into the solder plate cavity;

FIG. 5 is an enlarged fragmentary view illustrating selective solder masking of a lead of the component.

FIG. 6 is a view similar to FIG. 4 illustrating placement of the component of FIG. 1 on the solder transfer plate of FIG. 2;

FIG. 7 is a view illustrating a body of solder material applied to a lead of the component; and FIG. 8 is a partial perspective view similar to FIG. 1 illustrating a body of solder applied to each lead.

DETAILED DESCRIPTION

Figure 1:
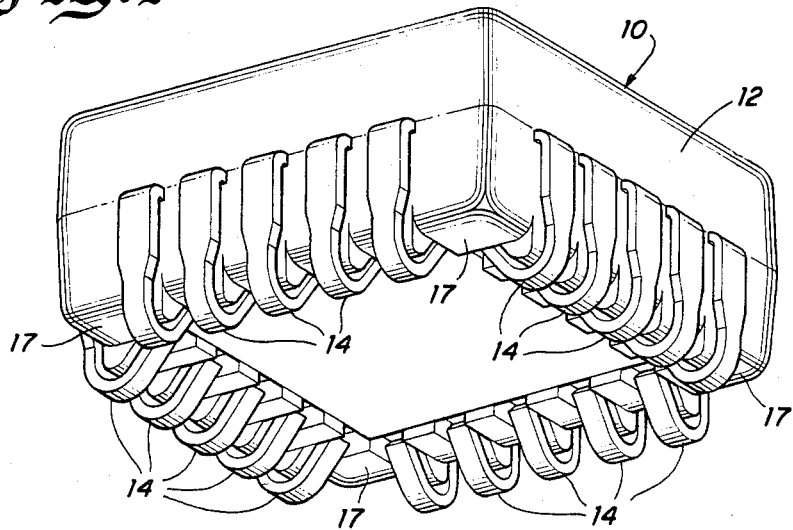
FIG. 1 is a perspective view of a component having leads to be provided with solder in accordance with the present invention.

Having reference now to the drawings, in FIG. 1 there is illustrated a component 10 having a body 12 from which extend numerous spaced apart conductive leads, metallizations or pads 14. The present invention is employed to bond to each lead 14 of solder such as the body 16 illustrated in FIG. 8. Subsequently, the component 10 can be attached by a known surface mount technique to conductive regions of a substrate by vapor phase, infrared or other solder reflow process.

The component 10 illustrated by way of example is a 20 lead plastic leaded chip carrier (PLCC) having a generally square array or footprint of leads lying in a flat plane. The leads 14 extend beyond projections or feet 17 located at the corners of the body 12. Surface mount techniques are used to secure a wide variety of components or devices to substrates such as circuit boards. The principles of the present invention are applicable to all such devices and the present invention is particularly advantageous with devices having high lead counts and close contact spacings. Although the illustrated component 10 includes J leads formed under the edges of body 12, the invention is applicable as well to other lead configurations such as outwardly extending gull-wing leads, downwardly extending I leads and other leads or metallizations of various types.

Figure 2:
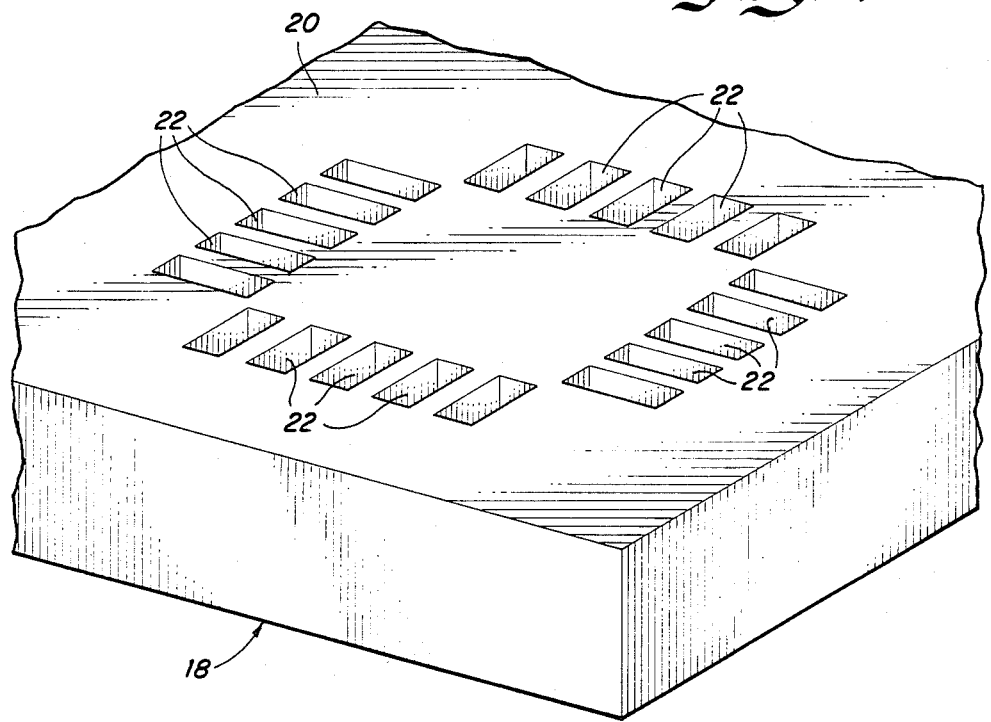
FIG. 2 is a perspective view of a solder transfer member of the present invention.

FIG. 2 illustrates a solder transfer member 18 constructed in accordance with the principles of the present invention and used in carrying out the method of the present invention. Member 18 in the illustrated embodiment of the invention is a plate including a flat upper surface 20 in which is formed an array or pattern of cavities 22. Cavities 22 are arrayed in the same pattern as the patterns of leads 14 of component 10. While a single array of cavities 22 for the single component 10 is illustrated, such cavities may be arrayed in different patterns for different lead configurations of other component types, and multiple cavity arrays may be provided so that the method of the invention may be performed simultaneously on more than one component.

Member 18 is made of material compatible with solder reflow temperatures. In addition, at least the surface 20 and the walls of cavities 22 are made of a material non-wetted by solder so that after bodies 16 of solder are applied to leads 14 of component 10, bodies 16 do not adhere to member 18 and the component can readily be removed from the solder transfer member 18.

A preferred material is titanium, and in the illustrated embodiment of the invention the solder transfer member 18 is a solid block or plate of titanium in which cavities 22 are formed by a fabricating operation such as electro-discharge machining (EDM).

In carrying out the method of the present invention using the solder transfer member 18, the cavities 22 are loaded with a solder material 24 (FIG. 4). A solder paste 24 is placed on the surface 20 of the member 18 over and around the region containing the array of cavities 22. The cavities 22 are filled with solder paste 24 and solder paste is removed from the surface 20. This can conveniently and quickly be done simply by wiping the surface 20 with a tool 26 such as a blade or squeegee so that the removal of excess paste 24A from surface 20 is performed simultaneously with forcing paste 24 into the cavities 22. A rubber wiping blade 26 with a Durometer hardness of 70 has been found well suited for this purpose. As blade 26, oriented at an angle as shown in FIG. 4, moves across surface 20, it fills each cavity 22 with paste 24 while removing excess paste 24A from member 18. For cavities that are relatively deep, in order to facilitate complete filling of the cavities 22, a restricted bleed opening such as opening 28 shown in broken lines in FIG. 4 may communicate with the bottom of each cavity 22 for the escape of trapped air. Also, multiple wiping operations with the blade 26 may be required for complete filling.

The use of solder paste 24 and blade 26 provides a dependable and quick way to uniformly fill the cavities 22 with solder material. However, solder paste or other types of solder material might be placed into cavities 22 using different methods if desired.

After solder material 24 has been loaded into cavities 22, the component 10 is placed upon the surface 20 with each lead 14 placed into contact with solder material 24 in the recesses. In the illustrated arrangement, the the feet 17 on the underside of body 12 rest upon the flat upper surface 20 of the solder transfer member 18 accurately to control penetration of the leads 14 into the cavities 22. The leads 14 are suspended in registration with cavities 22, and the lowermost portions of the leads 14 are received within the cavities 22 in contact with solder paste 24. A high degree of skill and care is not required because when the component 10 is in the proper position, entry of the leads 14 into the cavities 22 provides a definite tactile feel and misalignment of the component 10 relative to the member 18 is easily avoided.

Bonding of solder bodies 16 to leads 14 is achieved by reflow of the solder material 24 in the cavities 22. For example, the transfer member 18 with solder paste 24 and component 10 in place may be subjected to any well known vapor phase or other solder reflow process.

Reflow of the solder paste 24 in each cavity 27 causes the solder component of the material to melt and form a cohesive mass of molten solder contacting and adhering to the corresponding lead 14. Upon cooling, the mass of solder hardens and becomes the body 16 of solder adhered to the corresponding lead 14 as illustrated in FIG. 7.

An important advantage of the present invention is that the volume of the solder body 16 applied to each lead 14 can be precisely determined in order to optimize the solder joint formed in a subsequent surface mount operation. The amount of solder contained in each solder body 16 is determined by the volume of each recess 22. A typical solder paste used in carrying out the present invention includes about 60 percent by volume of particulate solder and about 40 percent by volume of other constituents such as flux, solvents and the like. Thus, a body 16 of solder applied to a lead 14 in carrying out the preferred embodiment of the present invention has a volume equal to about 60 percent of the volume of recess 22. For different solder pastes or other solder materials, the exact proportions may differ but in each case the volume of the solder body can precisely be determined in accordance with the amount of solder material received in a cavity 22 and the proportion of solder contained in the solder material.

Another important advantage of the present invention is that a relatively large volume of solder may be applied to each lead 14. This assures that consistent and reliable solder joints are obtained in a subsequent surface mount operation. Since the solder material 24 is confined in cavities 22 during reflow bonding to leads 14, bridging of solder between leads 14 is positively prevented.

Another advantage of the present invention is the uniformity achieved in the amount of solder applied to each lead 14 and the fact that this uniformity is obtained without the necessity for time consuming and painstaking application of solder material to the transfer member 18. Problems resulting from misregistration of a screen printing stencil are avoided. Once the member 18 has been fabricated with the cavities 22 precisely configured and positioned, all that is required to assure accurately positioned uniform solder volumes is the easily performed step of filling the cavities 22.

Cavities 22 in the illustrated arrangement are rectangular in shape having rectangular mouths or openings coinciding with the flat upper surface 20 of the member 18. The cavities are shaped so that clearance exits between the leads 14 and the ends, sides and bottoms of cavities 22. Other shapes may be employed if desired. To facilitate removal of the leads 14 with bodies 16 of solder bonded thereto from the cavities 22, the cavities should be shaped so that they are unrestricted and not reeentrant. This prevents the bodies of solder 16 from being trapped within the cavities 22 and interfering with separation of the component 10 from the member 18.

Depending on the characteristics of the leads 14, the size of the cavities 22 and other factors, it may be desirable to limit or prevent wicking of solder in an unrestrained fashion over the leads 14 while the reflow bonding operation is performed. In accordance with a feature of the invention, a selective masking technique is carried out to limit bonding of the bodies 16 of solder to selected limited areas of the surfaces of leads 14.

Leads 14 are selectively masked by applying a solder masking coating to the leads and then removing the coating from those selected areas where bonding is desired. A preferred selective masking process in accordance with the present invention includes applying a coating of a soluble solder mask material such as "Wonder Mask W", a water soluble solder mask available from Tech Spray, Inc. of Amarillo, Tex. This material is applied as a liquid and dries to form a uniform mask coating 30 adhering to the entire exposed surfaces of metal leads 14.

After the mask 30 is applied, it is removed from a selected portion of the area of each lead 14. As illustrated in FIG. 5, the soluble mask material 30 is removed simply by placing the component 10 down upon a surface 32 charged with water or other solvent capable of dissolving the mask coating 30. For example, surface 32 may comprise a towel or other absorbent substrate in which water or other solvent is contained.

Those parts of leads 14 contacting surface 32 are exposed to water or other solvent. In this limited region, the mask coating 30 is dissolved exposing the underlying surface of the leads. When bodies 16 are subsequently bonded to the leads 14, solder adheres only to the selected, non-masked areas so that the amount of solder available for subsequent surface bonding is not decreased by uncontrolled wicking of solder along leads 14. After the solder is bonded to the leads 14, the mask coating 30 is removed by, for example, immersing the component 10 in water or other solvent so that the component 10 carrying the solder bodies 16 is ready for reflow attachment to a substrate.

What is claimed is:

1. A method of applying discrete bodies of solder of predetermined size to the leads of a component for subsequent surface mount attachment by reflow to a substrate, the component leads lying in a generally planar pattern, said method comprising:
   arraying discrete quantities of solder material with respect to a solder transfer member in an array corresponding to the component lead pattern;
   locating the component on the solder transfer member with the component leads in contact with the solder material; and
   bonding a body of solder material to each lead by reflowing the discrete quantities of solder material;
   wherein the improvement is characterized by:
   said arraying step comprises loading the discrete quantities of solder material into cavities in a surface of the solder transfer member by filling the cavities with a nonsolid solder material, the cavities being in an array matching the pattern of component leads; and
   said locating step includes aligning the component leads in registration with the cavities and inserting at least a portion of each lead into one of the cavities.

2. A method as claimed in claim 1 wherein said loading step includes filling the cavities with solder paste.

3. A method as claimed in claim 2 wherein said filling step includes placing solder paste on the surface of the solder transfer member and wiping the surface of the solder transfer member while forcing the solder paste into the cavities.

4. A method as claimed in claim 1, said method further comprising selectively masking said component leads prior to said locating step to limit the adherence of solder to selected areas of the surfaces of said leads.

5. A method as claimed in claim 4, said masking step including coating said component leads with a masking material and removing the coating from the selected areas.

6. A method as claimed in claim 5, said coating step including applying a coating soluble in a solvent, and applying the solvent only to the selected areas.

7. A method as claimed in claim 6, said applying step including placing the component upon a surface charged with the solvent.

8. A method as claimed in claim 7 in which the solvent is water.

9. A method as claimed in claim 1 wherein said locating step consists essentially of resting the component upon the surface of the solder transfer member with the component leads extending into the cavities.

10. A method of forming discrete bonded solder bodies upon a substrate mountable device in a predetermined array of locations on the device, said method comprising:

filling an array of cavities with a nonsolid solder material, the array of cavities corresponding to the predetermined array of locations on the device;

placing the device adjacent the cavities with the array of cavities in registration with the predetermined array of locations on the device;

heating the solder material within the cavities to form a discrete body of molten solder in each cavity; and bonding the solder to the device by contacting the device with the molten solder and hardening the solder.

11. The method defined in claim 10 in which the step of filling comprises loading solder paste into the cavities.

12. The method defined in claim 11 further comprising applying a mask coating to the device and removing the mask coating from the predetermined array of locations on the device.

13. A method of preparing a conductive metal lead for surface mounting to a conductive region of a substrate with a solder joint having a predetermined volume of solder, said method comprising the steps of:

filling a cavity in a solder transfer member with nonsolid solder material including solder particles and other constituents, the cavity having a volume exceeding the predetermined volume by an amount related to the volume of the other constituents in the solder material;

heating the solder transfer member in order to melt the solder contained in the cavity; and bonding the solder to the lead by placing the lead in contact with the solder material while cooling the solder material.

14. The method defined in claim 13, the solder material comprising a solder paste and the other constituents including flux.

15. The method defined in claim 14, wherein the conductive lead is masked with a soluble solder mask, further comprising placing the lead against a solvent charged surface before said bonding step.

16. A solder transfer member for use in preparing a component for surface mounting to a substrate wherein the component has a plurality of spaced electrical leads with a generally planar footprint and the substrate has a pattern of conductive regions matching the footprint, said solder transfer member comprising:

a plate formed of a material remaining substantially rigid at a temperature above the melting point of solder;

said plate having a generally flat surface formed of a material non wetted by solder with a plurality of cavities defined therein extending from opening in said flat surface, said openings being arrayed in the pattern of the pattern of conductive regions;

said cavities being unrestricted and not reentrant to facilitate withdrawal of solid solder material from the cavity.

17. A solder transfer member as claimed in claim 16, said surface being formed of titanium.

18. A solder transfer member as claimed in claim 16, said plate being formed of titanium.

19. A solder transfer member as claimed in claim 16, further comprising a restricted air bleed opening communicating with each cavity.

* * * * *